United States Patent
Rho et al.

(10) Patent No.: US 7,962,841 B2
(45) Date of Patent: Jun. 14, 2011

(54) DATA DECODING APPARATUS AND METHOD IN A COMMUNICATION SYSTEM

(75) Inventors: Shi-Chang Rho, Suwon-si (KR); Jun Jin Kong, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 1258 days.

(21) Appl. No.: 11/592,381

(22) Filed: Nov. 3, 2006

(65) Prior Publication Data

US 2007/0168846 A1     Jul. 19, 2007

(30) Foreign Application Priority Data

Jan. 7, 2006   (KR) .................. 10-2006-0002058

(51) Int. Cl.
*H03M 13/03*     (2006.01)
(52) U.S. Cl. ........ 714/796; 714/760; 714/791; 714/797; 702/9; 326/11
(58) Field of Classification Search .................. None
See application file for complete search history.

(56) References Cited

U.S. PATENT DOCUMENTS

| | | | | |
|---|---|---|---|---|
| 4,715,037 A * | 12/1987 | Yagi | ............................... | 714/795 |
| 6,473,477 B2 * | 10/2002 | Watanabe | ..................... | 375/368 |
| 6,877,132 B1 * | 4/2005 | De et al. | ........................ | 714/795 |
| 7,187,729 B2 * | 3/2007 | Nagano | ......................... | 375/341 |
| 2002/0174402 A1 * | 11/2002 | Yamamoto | .................... | 714/795 |

* cited by examiner

*Primary Examiner* — Guy J Lamarre
(74) *Attorney, Agent, or Firm* — North Star Intellectual Property Law, PC

(57) ABSTRACT

A majority voting Viterbi decoder includes a branch metric calculator (BMC) for measuring a difference between a received symbol and a reference symbol and outputting branch metrics from the difference; an add-compare-selection (ACS) unit for determining an optimal path using the branch metrics; a survival path memory unit for outputting decoded symbols by performing decoding based on the optimal path; and a majority voting unit for determining a final decoded symbol by performing majority voting for the decoded symbols output from the survival path memory unit. Accordingly, by adding the majority voting unit, a decoding depth can be reduced without the loss of an encoding gain required in a system, and by reducing the decoding depth, miniaturization is possible, power consumption can be reduced, and a processing delay in a memory can be minimized.

15 Claims, 3 Drawing Sheets

DATA DECODING APPARATUS AND METHOD IN A COMMUNICATION SYSTEM

PRIORITY

This application claims priority under 35 U.S.C. §119 to an application filed in the Korean Intellectual Property Office on Jan. 7, 2006 and assigned Serial No. 2006-02058, the contents of which are incorporated herein by reference.

BACKGROUND OF THE INVENTION

1. Field of the Invention

Aspects of the present invention generally relate to a wireless communication system, and in particular, to a data decoding apparatus and method in a communication system for recovering data transmitted through a communication channel.

2. Description of the Related Art

In a digital data communication system, errors may occur in data transmitted through channels. Many error detection and signal recovery mechanisms have been used to detect and recover errors occurring in the transmission.

In general, channel encoding methods are used for error detection and correction, and surplus bits are added to information bits to support error detection and correction in a channel encoding process.

For the channel encoding methods, block encoding and convolution encoding methods are used, and an encoded bitstream is transmitted to a receiver through an additive white Gaussian noise (AWGN) channel and decoded through quantization and decoding by the receiver.

To decode a signal encoded using a convolution encoding method, a sequential decoding method or a Viterbi decoding method is used. The Viterbi decoding method is also called a maximum likelihood (ML) decoding method, and since the Viterbi decoding method has a fixed decoding time different from the sequential decoding method, the Viterbi decoding method can be easily implemented as hardware.

FIG. 1 is a schematic block diagram of a conventional Viterbi decoder. Referring to FIG. 1, the Viterbi decoder includes, as main components, a branch metric calculator (BMC) 11 for outputting branch metrics of input signals analog-to-digital converted and then serial-to-parallel converted, an add-compare-selection (ACS) unit 13 for calculating path metrics for states of a current stage and related state-transition branch metrics from path metrics of previous states and selecting a path having the minimum path metric as a survival path for the states of the current stage, a survival path memory unit 15 for generating decoded data from the survival path calculated by the ACS unit 13, and a path metric memory 17 for storing the path metrics.

Memory management methods for generating the decoded data in the survival path memory unit 15 include a traceback method and a register exchange method.

The traceback method requires a memory for storing a path history for a traceback operation and estimates an information stream by tracing back a survival path using a higher speed clock than a data rate. Since the register exchange method can be easily implemented using a node-serial type memory in systems not requiring high power and uses in general a compact memory, such as static random access memory (SRAM), the register exchange method can be implemented with little hardware. However, it is difficult to use the register exchange method in systems requiring high power due to overhead caused by the use of a high-speed clock.

In the register exchange method, a register bank having a node-parallel structure is used to store survival path information, and since the survival path information is stored in parallel in the register bank, a clock rate which is the same as a data rate can be used. In addition, since the register exchange method uses a parallel structure using the register bank, a relatively high-speed operation compared to the traceback method can be performed. However, if a constraint length increases, the complexity of a register bank network for storing the survival path information also increases.

In addition, if the traceback method and the register exchange method are applied, when a decoding depth increases, the size of hardware for a survival path memory also increases, thereby increasing a delay. In particular, in the traceback method, a clock rate for tracing back a survival path increases.

SUMMARY OF THE INVENTION

A general aspect of the present invention is to provide a decoder for reducing a decoding depth without the loss of a decoding gain in a system.

Another general aspect of the present invention is to provide a decoder, which can be miniaturized and reduce power consumption by reducing a decoding depth.

A further general aspect of the present invention is to provide a decoder for reducing a processing delay in a memory by reducing a decoding depth.

According to one aspect of the present invention, there is provided a majority voting Viterbi decoder of a receiver for receiving and decoding a symbol encoded in a convolution encoding method, the decoder including a branch metric calculator (BMC) for measuring a difference between the received symbol and a reference symbol and outputting branch metrics from the difference; an add-compare-selection (ACS) unit for determining an optimal path using the branch metrics; a survival path memory unit for outputting decoded symbols by performing decoding based on the optimal path; and a majority voting unit for determining a final decoded symbol by performing majority voting for the decoded symbols output from the survival path memory unit.

BRIEF DESCRIPTION OF THE DRAWINGS

General aspects of the present invention will become more apparent from the following detailed description when taken in conjunction with the accompanying drawings in which.

DETAILED DESCRIPTION

General aspects of the present invention will be described herein below with reference to the accompanying drawings.

Figure 1:
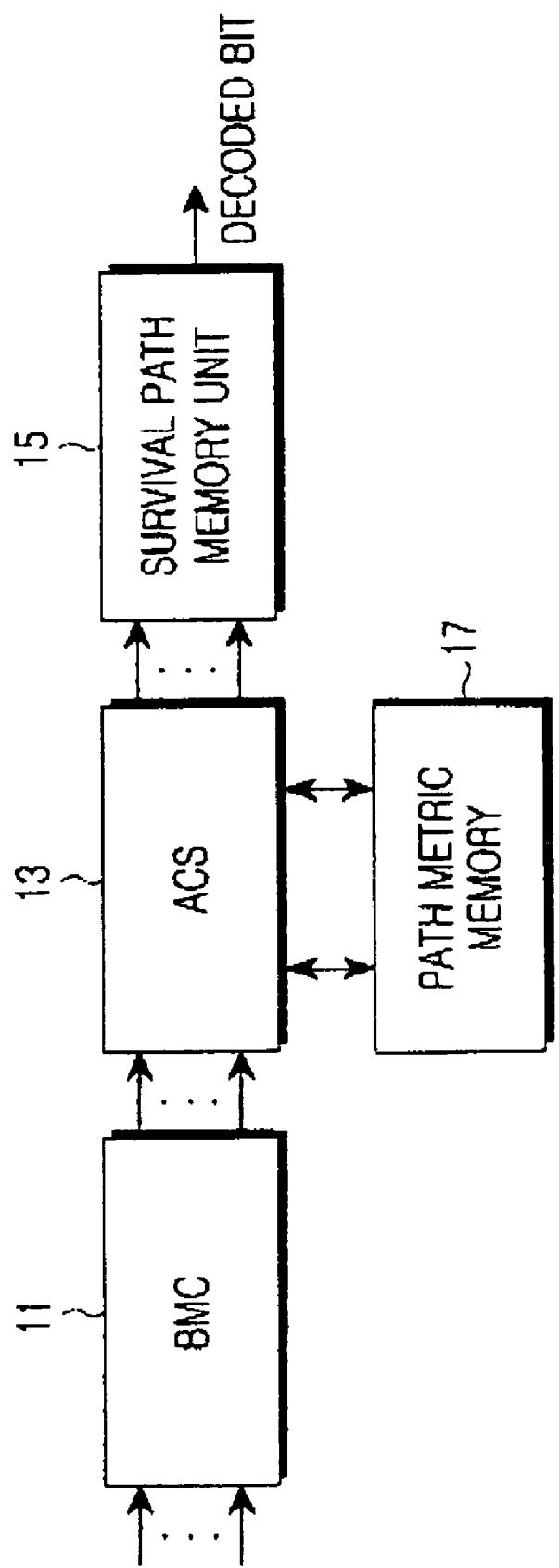
FIG. 1 is a schematic block diagram of a conventional Viterbi decoder.
Figure 2:
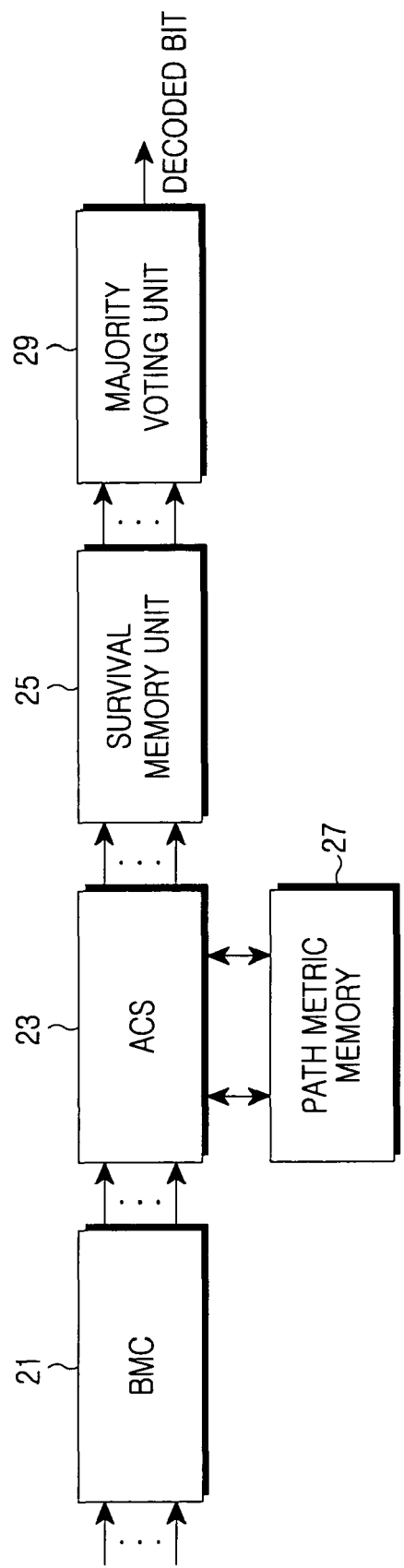
FIG. 2 is a schematic block diagram of a majority voting Viterbi decoder (MV VD) according to general aspects of the present invention.

FIG. 2 is a schematic block diagram of a majority voting Viterbi decoder (MV-VD) according to general aspects of the present invention. Referring to FIG. 2, the MV-VD includes a BMC 21 for outputting branch metrics of input signals, an ACS unit 23 for calculating path metrics for states of a current stage and related state-transition branch metrics from path metrics of previous states and selecting a path having the minimum path metric as a survival path for the states of the current stage, a survival memory unit 25 for generating decoded data from the survival path calculated by the ACS unit 23, a path metric memory 27 for storing the path metrics, and a majority voting unit 29 for outputting a decoded bit by performing majority voting for the decoded bits output from the survival memory unit 25.

The BMC 21 calculates trellis branch metrics between a received symbol and a corresponding branch symbol using a Hamming distance. When the branch metrics are calculated, the ACS unit 23 calculates a new path metric set having each state at each time-step. Then, the ACS unit 23 selects a survival path for each state and updates the survival memory unit 25 according to the selection result. The survival memory unit 25 stores a survival path history of each time-step.

The capacity of the survival memory unit 25 is determined by a trellis decoding depth L determined as a multiple of a constraint length K.

The majority voting unit 29 outputs a decoded bit by performing the majority voting for signals output through a plurality of survival paths from the survival memory unit 25.

As described above, by applying a decoding depth lower than that required in single-path decoding to a system performing Viterbi decoding using majority voting for signals decoded from a plurality of survival paths, the capacity of the survival memory unit 25 can be reduced.

Table 1 shows an experiment result obtained by comparing decoding depths in the same performance when the MV-VD according to general aspects of the present invention and a conventional single path decoder (SPD) are applied to a communication system based on convolution encoding used in the IEEE 802.11n standard.

In the experiment, decoding depths when code rates are 1/2, 2/3, 3/4, and 5/6 in an encoder of which a constraint length K is 7 and a generator polynomial is $\{133,171\}_g$ are measured.

TABLE 1

| Decoding depth | Code rate | | | |
| --- | --- | --- | --- | --- |
|  | 1/2 | 2/3 | 3/4 | 5/6 |
| SPD | 7K | 8.5K | 9K | 16.5K |
| MV-VD | 5K | 6K | 7K | 11K |

As illustrated in Table 1, the MV-VD according to general aspects of the present invention has a lower decoding depth compared to the SPD at all code rates. In particular, when the code rate is 5/6, the MV-VD has the same performance with a 5.5K-reduced decoding depth compared to the SPD.

Figure 3:
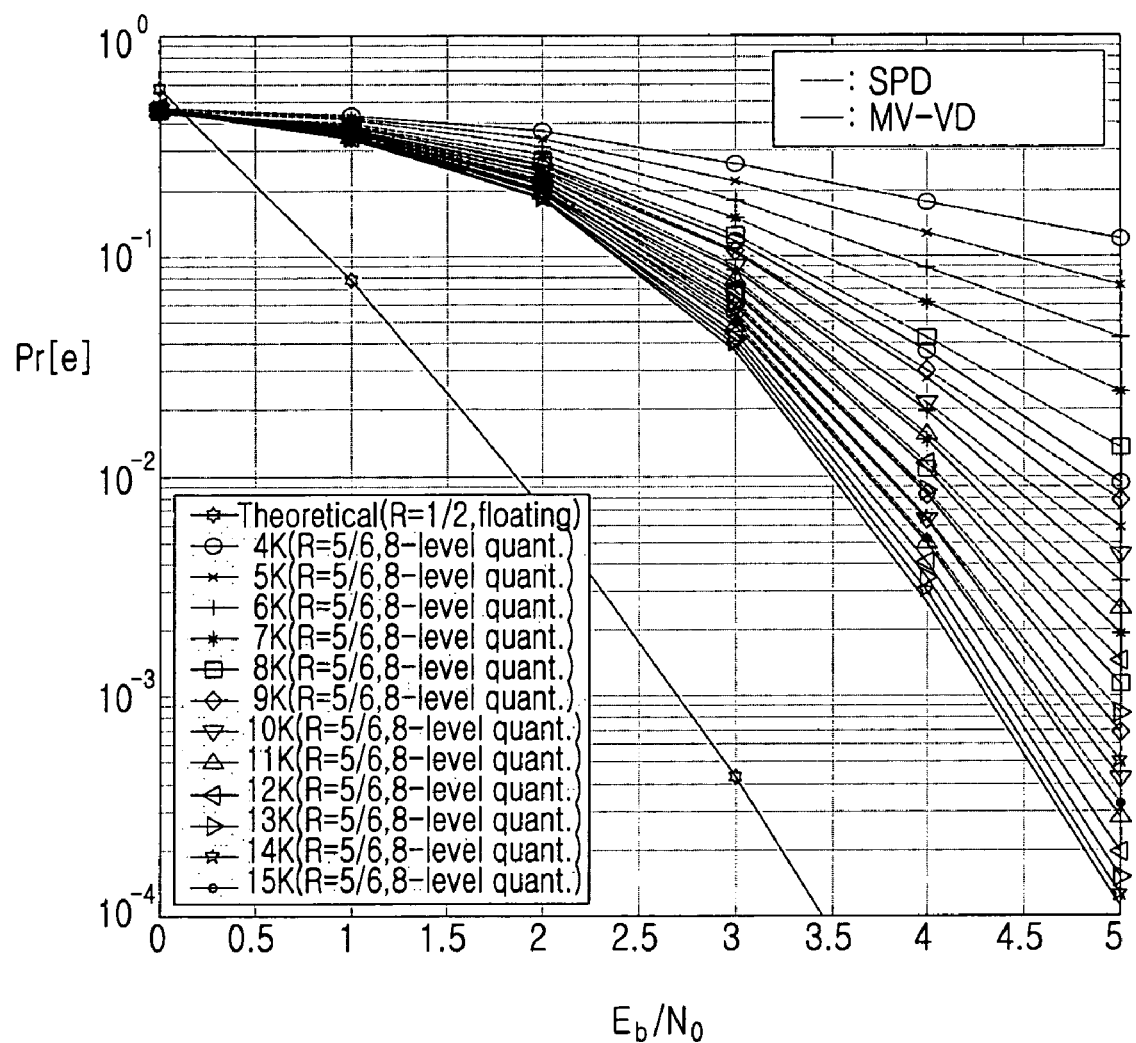
FIG. 3 is a diagram for comparing power consumption rates according to bit error rates of the MV-VD according to general aspects of the present invention and a single path decoder when a code rate is 5/6.

FIG. 3 is a diagram for comparing power consumption rates according to bit error rates of an MV-VD according to general aspects of the present invention and an SPD when a code rate is 5/6.

As illustrated in FIG. 3, the power consumption of both the MV-VD and the SPD is reduced as the decoding depth is lower, and in the case of the same decoding depth, the power consumption of the MV-VD is significantly reduced.

As described above, in a Viterbi decoder according to general aspects of the present invention, a decoding depth can be reduced without the loss of an encoding gain required in a system.

In addition, by reducing the decoding depth, miniaturization is possible, and power consumption can be reduced.

In addition, by reducing the decoding depth, a processing delay in a memory can be minimized.

While the invention has been shown and described with reference to general aspects thereof, it will be understood by those skilled in the art that various changes in form and details may be made therein without departing from the spirit and scope of the invention as defined by the appended claims.

What is claimed is:

1. A majority voting Viterbi decoder of a receiver, the decoder being configured to receive and decode a symbol encoded in a convolution encoding method, the decoder comprising:
   a branch metric calculator (BMC) configured to measure a difference between the received symbol and a reference symbol and output branch metrics from the difference;
   an add-compare-selection (ACS) unit configured to determine an optimal path using the branch metrics;
   a survival path memory unit configured to output decoded symbols by performing decoding based on the optimal path; and
   a majority voting unit configured to determine a final decoded symbol by performing majority voting for the decoded symbols from the survival path memory unit,
   wherein a decoding depth required by the survival path memory unit when outputting the decoded symbols to the majority voting unit is less than a decoding depth required by the survival path memory unit when outputting the decoded symbols other than to the majority voting unit.

2. The decoder of claim 1, wherein the survival path memory unit is configured to perform the decoding based on a register exchange algorithm.

3. The decoder of claim 1, wherein the survival path memory unit is configured to perform the decoding based on a traceback algorithm.

4. The decoder of claim 1, wherein, when a constraint length is 7 and a generator polynomial is $\{133,171\}_8$, the decoding depth required by the survival path memory unit when outputting the decoded symbols to the majority voting unit is 5K at a code rate of 1/2.

5. The decoder of claim 1, wherein, when a constraint length is 7 and a generator polynomial is $\{133,171\}_8$, the decoding depth required by the survival path memory unit when outputting the decoded symbols to the majority voting unit is 6K at a code rate of 2/3.

6. The decoder of claim 1, wherein, when a constraint length is 7 and a generator polynomial is $\{133,171\}_8$, the decoding depth required by the survival path memory unit when outputting the decoded symbols to the majority voting unit is 7K at a code rate of 3/4.

7. The decoder of claim 1, wherein, when a constraint length is 7 and a generator polynomial is $\{133,171\}_8$, the decoding depth required by the survival path memory unit when outputting the decoded symbols to the majority voting unit is 11K at a code rate of 5/6.

8. The decoder of claim 1, wherein, when a constraint length is 7 and a generator polynomial is $\{133,171\}_8$, the decoding depth required by the survival path memory unit when outputting the decoded symbols to the majority voting unit is reduced by 2K at a code rate of 1/2 compared with the decoding depth required by the survival path memory unit when outputting the decoded symbols other than to the majority voting unit.

9. The decoder of claim 1, wherein, when a constraint length is 7 and a generator polynomial is $\{133,171\}_8$, the decoding depth required by the survival path memory unit when outputting the decoded symbols to the majority voting unit is reduced by 2.5K at a code rate of 2/3 compared with the decoding depth required by the survival path memory unit when outputting the decoded symbols other than to the majority voting unit.

10. The decoder of claim 1, wherein, when a constraint length is 7 and a generator polynomial is $\{133,171\}_8$, the decoding depth required by the survival path memory unit when outputting the decoded symbols to the majority voting unit is reduced by 2K at a code rate of ¾ compared with the decoding depth required by the survival path memory unit when outputting the decoded symbols other than to the majority voting unit.

11. The decoder of claim 1, wherein, when a constraint length is 7 and a generator polynomial is $\{133,171\}_8$, the decoding depth required by the survival path memory unit when outputting the decoded symbols to the majority voting unit is reduced by 5.5K at a code rate of ⅚ compared with the decoding depth required by the survival path memory unit when outputting the decoded symbols other than to the majority voting unit.

12. A majority voting Viterbi decoding method in a receiver, the decoding method being configured to receive and decode a symbol encoded in a convolution encoding method, the decoding method comprising:
    measuring a difference between the received symbol and a reference symbol and outputting branch metrics from the difference;
    determining an optimal path using the branch metrics;
    outputting decoded symbols by performing decoding based on the optimal path; and
    determining a final decoded symbol by performing majority voting for the decoded symbols,
    wherein a decoding depth required by the outputting of the decoded symbols for the performing of the majority voting is less than a decoding depth required by the outputting of the decoded symbols for other than the performing of the majority voting.

13. The decoding method of claim 12, wherein the decoded symbols are outputted through a register exchange algorithm.

14. The decoding method of claim 12, wherein the decoded symbols are outputted through a traceback algorithm.

15. A majority voting Viterbi decoder of a receiver, the decoder being configured to receive and decode a symbol encoded in a convolution encoding method, the decoder comprising:
    a branch metric calculator (BMC) configured to measure a difference between the received symbol and a reference symbol and output branch metrics from the difference;
    an add-compare-selection (ACS) unit configured to determine an optimal path using the branch metrics;
    a survival path memory unit configured to output decoded symbols from the symbol, the symbol being encoded by convolution encoding used in IEEE 802.11n; and
    a majority voting unit configured to determine a final decoded symbol by performing majority voting for the decoded symbols from the survival path memory unit;
    wherein a decoding depth required by the survival path memory unit when outputting the decoded symbols to the majority voting unit is less than a decoding depth required by the survival path memory unit when outputting the decoded symbols other than to the majority voting unit.

* * * * *